(12) United States Patent  
Chu et al.

(10) Patent No.: US 11,849,608 B2  
(45) Date of Patent: Dec. 19, 2023

(54) FLEXIBLE DISPLAY SUBSTRATE AND METHOD FOR PREPARING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhiwen Chu, Beijing (CN); Mengmeng Du, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 471 days.

(21) Appl. No.: 15/733,851

(22) PCT Filed: Mar. 25, 2020

(86) PCT No.: PCT/CN2020/081014  
§ 371 (c)(1),  
(2) Date: Nov. 30, 2020

(87) PCT Pub. No.: WO2021/189276  
PCT Pub. Date: Sep. 30, 2021

(65) Prior Publication Data  
US 2021/0384277 A1    Dec. 9, 2021

(51) Int. Cl.  
*H10K 59/131* (2023.01)  
*H10K 71/00* (2023.01)  
(Continued)

(52) U.S. Cl.  
CPC ........... *H10K 59/131* (2023.02); *H10K 71/00* (2023.02); *H10K 77/111* (2023.02);  
(Continued)

(58) Field of Classification Search  
CPC .... H10K 59/131; H10K 71/00; H10K 77/111; H10K 59/1201; H10K 2102/311;  
(Continued)

(56) References Cited

U.S. PATENT DOCUMENTS

2018/0342707 A1* 11/2018 Lee ..................... H10K 71/00  
2019/0181361 A1 6/2019 Kim et al.  
(Continued)

FOREIGN PATENT DOCUMENTS

CN    109256400 A    1/2019  
CN    109360830 A    2/2019  
(Continued)

*Primary Examiner* — J. E. Schoenholtz  
(74) *Attorney, Agent, or Firm* — McCoy Russell LLP

(57) ABSTRACT

The present disclosure provides a flexible display substrate, a method for preparing the same and a display device. The flexible display substrate includes a flexible substrate and a display function layer, the display function layer including a first metal layer and a second metal layer; the flexible display substrate includes a display area and a peripheral area, and the peripheral area including a bending area, a first wiring area located between the display area and the bending area, and a second wiring area located on a surface of the bending area away from the display area; the signal wiring of the first wiring area and the second signal wiring of the second wiring area being electrically connected through the signal connection line of the bending area, and the signal connection line being made of the first metal layer and/or the second metal layer.

20 Claims, 10 Drawing Sheets

(51) Int. Cl.
*H10K 77/10* (2023.01)
*H10K 59/12* (2023.01)
*H10K 102/00* (2023.01)

(52) U.S. Cl.
CPC .... *H10K 59/1201* (2023.02); *H10K 2102/311* (2023.02); *H10K 2102/341* (2023.02)

(58) Field of Classification Search
CPC .......... H10K 2102/341; H10K 59/124; H10K 2102/351; Y02E 10/549; H01L 27/12
See application file for complete search history.

(56) References Cited

U.S. PATENT DOCUMENTS

| | | |
|---|---|---|
| 2019/0324567 A1* | 10/2019 | Hong ................... H10K 71/00 |
| 2019/0355799 A1 | 11/2019 | Jeong et al. |
| 2020/0013970 A1 | 1/2020 | Wang et al. |
| 2020/0161572 A1 | 5/2020 | Zheng et al. |

FOREIGN PATENT DOCUMENTS

| | | | |
|---|---|---|---|
| CN | 109449163 | A | 3/2019 |
| CN | 110504276 | A | 11/2019 |

\* cited by examiner

FLEXIBLE DISPLAY SUBSTRATE AND METHOD FOR PREPARING THE SAME, AND DISPLAY DEVICE

CROSS REFERENCE TO RELATED APPLICATIONS

This application is the U.S. national phase of PCT Application No. PCT/CN2020/081014 filed on Mar. 25, 2020, the disclosures of which are incorporated in their entirety by reference herein.

TECHNICAL FIELD

The present disclosure relates to the field of display technology, in particular to a flexible display substrate, a method for preparing the same, and a display device.

BACKGROUND AND SUMMARY

The existing flexible display substrate is divided into a display area and an electrode binding area. In order to realize the narrow frame of the flexible display device, the part of the flexible display substrate corresponding to the electrode binding area is bent in a direction away from the display surface, and the bending area is located between the display area and the electrode binding area.

The technical problem to be solved by the present disclosure is to provide a flexible display substrate, a method for preparing the same, and a display device, that are capable of reducing the number of the patterning process for preparing the flexible display substrate, and reducing the time and the cost for preparing the flexible display substrate.

To solve the above technical problems, the embodiments of the present disclosure provide technical solutions as follows.

The embodiments of the present disclosure provide a flexible display substrate. The flexible display substrate includes a flexible substrate and a display function layer located on the flexible substrate, the display function layer including a first metal layer and a second metal layer located on a surface of the first metal layer away from the flexible substrate;

the flexible display substrate includes a display area and a peripheral area, the peripheral area including a bending area extending from the display area in a first direction, a first wiring area located between the display area and the bending area, and a second wiring area located on a surface of the bending area away from the display area, the bending area being bent along a second direction, and the first direction being substantially perpendicular to the second direction; and signal wirings of the first wiring area and of the second wiring area are separated from each other, the signal wiring of the first wiring area and the second signal wiring of the second wiring area being electrically connected through a signal connection line of the bending area, at least part of the signal wirings of the first wiring area and the second wiring area being located on a layer different from the signal connection lines of the bending area, and the signal connection line being made of the first metal layer and/or the second metal layer.

In some embodiments, the signal connection line is made of the second metal layer.

In some embodiments, in the first wiring area and the second wiring area, the signal wirings are directly connected to the signal connection line, or the signal wirings are connected to the signal connection line through a transition connection line formed by the first metal layer.

In some embodiments, the signal wirings includes a first signal wiring formed by a third metal layer and a second signal wiring formed by a fourth metal layer, the third metal layer being located on a surface of the fourth metal layer proximate to the flexible substrate, and the fourth metal layer being located on a surface of the first metal layer proximate to the flexible substrate.

In some embodiments, the first signal wiring and the second signal wiring are alternately arranged in a second direction, an orthogonal projection of the first signal wiring on the flexible substrate not overlapping an orthogonal projection of the second signal wiring on the flexible substrate.

In some embodiments, the display function layer includes a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate, the first metal layer being the first source-drain metal layer, the second metal layer being the second source-drain metal layer, the third metal layer being the first gate metal layer, and the fourth metal layer being the second gate metal layer; and in the bending area, the display function layer includes: the first planarization layer, the second source-drain metal layer and the second planarization layer, the first planarization layer and the second planarization layer being in direct contact with the second source-drain metal layer.

In some embodiments, the flexible substrate includes a first organic thin film, a first inorganic layer, a second organic thin film, and a second inorganic layer that are stacked in sequence, the second inorganic layer being located on a surface of the second organic thin film proximate to the display function layer, and the second inorganic layer in the bending area having a thickness less than that of the second inorganic layer in other areas.

In some embodiments, a first thickness of the flexible display substrate in the first wiring area is equal to a second thickness of the flexible display substrate in the second wiring area, and a difference between a third thickness of the flexible display substrate in the bending area and the first thickness of the flexible display substrate in the first wiring area is less than 20% of the third thickness.

In some embodiments, in the first wiring area, the signal connection line made of the second source-drain metal layer is connected to the first signal wiring made of the first gate metal layer through a first connection portion, an area where the first connection portion is located being provided with a plurality of via holes located in a same straight line, and the first connection portion being connected to the first signal wiring through the plurality of via holes; and the signal connection line made of the second source-drain metal layer is connected to the second signal wiring made of the second gate metal layer through the second connection portion, an area where the second connection portion is located being provided with a plurality of via holes located in a same straight line, and the second connection portion being connected to the second signal wiring through the plurality of via holes;

in the second wiring area, the signal connection line made of the second source-drain metal layer is connected to the first signal wiring made of the first gate metal layer through a third connection portion, an area where the third connection portion is located being provided with a plurality of via holes located in a same straight line, and the third connection portion being connected to the first signal wiring through the plurality of via holes; and the signal connection line made of the second source-drain metal layer is connected to the second signal wiring made of the second gate metal layer through a fourth connection portion, an area where the fourth connection portion is located being provided with a plurality of via holes located in a same straight line, and the fourth connection portion being connected to the second signal wiring through the plurality of via holes.

In some embodiments, widths of the first connection portion and the second connection portion are both greater than widths of other portions in the signal connection line; and/or widths of the third connection portion and the fourth connection portion are both greater than widths of other portions in the signal connection line.

In some embodiments, in the first wiring area, the first connection portion and the second connection portion adjacent to each other are staggered in the second direction by a certain distance; and/or in the second wiring area, the third connection portion and the fourth connection portion adjacent to each other are staggered in the second direction by a certain distance.

An embodiment of the present disclosure also provides a display device including the flexible display substrate as described above.

The embodiments of the present disclosure further provides a method for preparing a flexible display substrate including a flexible substrate and a display function layer located on the flexible substrate, in which the display function layer includes a first metal layer and a second metal layer located on a surface of the first metal layer away from the flexible substrate;

the flexible display substrate includes a display area and a peripheral area, the peripheral area including a bending area extending from the display area in a first direction, a first wiring area located between the display area and the bending area, and a second wiring area located on a surface of the bending area away from the display area, the bending area being bent along a second direction, and the first direction being substantially perpendicular to the second direction; and signal wirings of the first wiring area and the second wiring area are separated from each other, and the method includes:

forming a signal connection line by the first metal layer and/or the second metal layer in the bending area, the signal connection line connecting the signal wiring of the first wiring area and the signal wiring of the second wiring area, and at least part of the signal wirings in the first wiring area and the second wiring area being located in a layer different from the signal connection lines in the bending area.

In some embodiments, the forming the signal connection line by the first metal layer and/or the second metal layer in the bending area includes:

forming the signal connection line by the second metal layer.

In some embodiments, it further includes:

forming a transition connection line by the first metal layer in the first wiring area and the second wiring area, the transition connection line being connected to the signal wiring; and the forming the signal connection line includes:

forming the signal connection line connected to the transition connection line in the first wiring area and the second wiring area.

In some embodiments, the forming the signal wiring includes:

forming a first signal wiring by a third metal layer, and forming a second signal wiring by a fourth metal layer, the third metal layer being located on a surface of the fourth metal layer proximate to the flexible substrate, and the fourth metal layer being located on a surface of the first metal layer proximate to the flexible substrate.

In some embodiments, the display function layer includes a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate, the first metal layer being the first source-drain metal layer, the second metal layer being the second source-drain metal layer, the third metal layer being the first gate metal layer, and the fourth metal layer being the second gate metal layer; and the method specifically includes:

after the forming the interlayer insulating layer, etching the interlayer insulating layer, the second gate insulating layer and the first gate insulating layer in the bending area, to remove the interlayer insulating layer, the second gate insulating layer, and the first gate insulating layer in the bending area;

etching the buffer layer in the bending area, to remove the buffer layer in the bending area, and to form a groove exposing the flexible substrate in the bending area;

forming the first planarization layer, the first planarization layer filling the groove in the bending area;

forming a pattern of the second source-drain metal layer on the first planarization layer, a pattern of the second source-drain metal layer including the signal connection line; and forming the second planarization layer.

Figure 1:
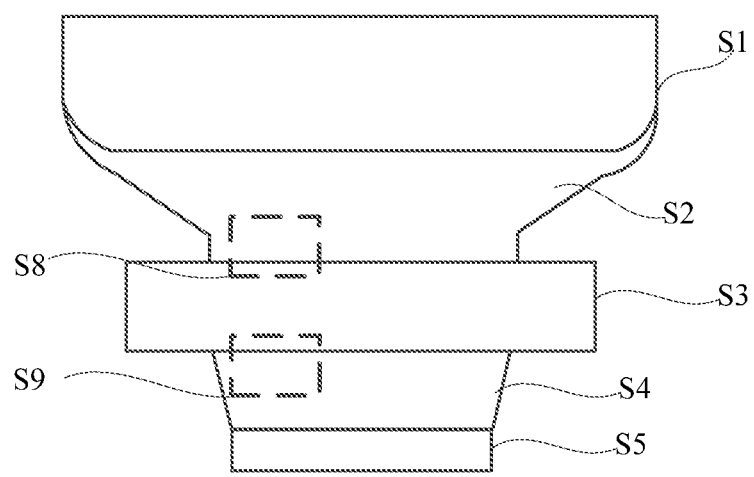
FIG. 1 is a schematic plan view showing a flexible display substrate.

REFERENCE NUMBERS 11 first organic thin film
12 first inorganic layer
13 second organic thin film
14 second inorganic layer 2 buffer layer
3 first gate insulating layer
4 second gate insulating layer
5 interlayer insulating layer
6 organic material layer
7 first planarization layer
8 second planarization layer
9 passivation layer
21 first gate metal layer
22 second gate metal layer
23 first source-drain metal layer
24 second source-drain metal layer
31 active layer
32 pixel definition layer
33 anode.

DETAILED DESCRIPTION

In order to make the technical problems to be solved, the technical solutions, and the advantages of the examples of the present disclosure, the present disclosure will be described hereinafter in conjunction with the drawings and specific examples.

As shown in FIG. 1, the flexible display substrate can be divided into a display area S1, a first wiring area S2, a bending area S3, a second wiring area S4, and an electrode binding area S5. In order to realize the narrow frame of the flexible display device, the portion of the flexible display substrate corresponding to the electrode binding area S5 is bent in a direction away from the display surface. In order to relieve the stress generated by the inorganic film layer in the bending area during bending, the inorganic film layer in the bending area having a relatively high hardness, such as silicon oxide, silicon nitride, etc., is removed in advance, and there is a segment difference in the bending area after removing the inorganic film layer. In order to reduce the segment difference and ensure the electrical connection between the display area and the electrode binding area, in related art, the bending area is filled with organic material through a special patterning process after the inorganic thin film in the bending area is removed.

Figure 2:
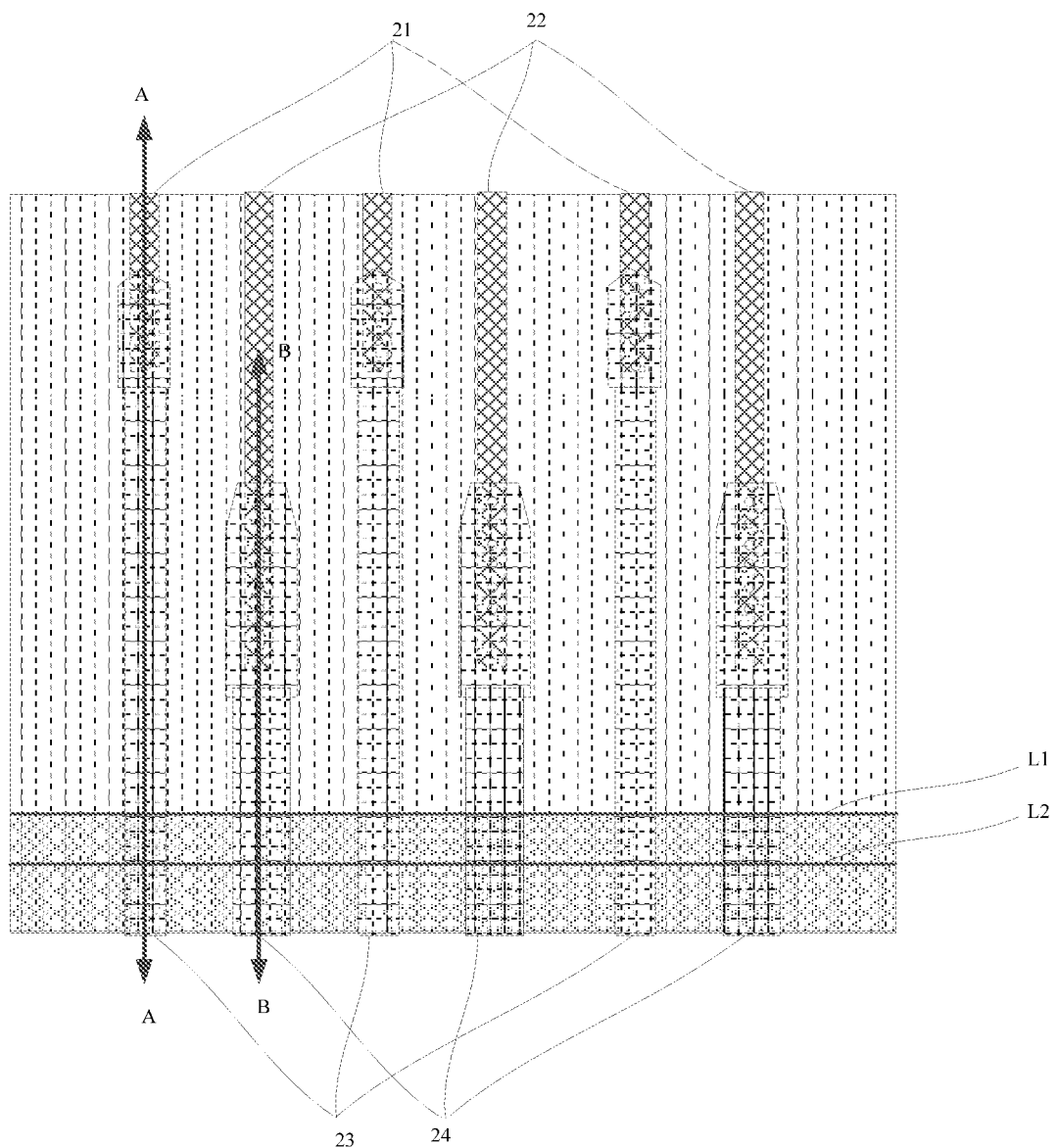
FIG. 2 is a schematic plan view showing a first wiring area of a flexible display substrate in the related art.

FIG. 2 is an enlarged schematic view of the area S8. As shown in FIG. 2, a first signal line made of the first gate metal layer 21 and a second signal line made of the second gate metal layer 22 are provided in the first wiring area S2, in which the first signal wiring of the first wiring area S2 is connected to the first signal wiring of the second wiring area S4 through the signal connection line made of the first source-drain metal layer 23, and the second signal wiring of the first wiring area S2 is connected to the second signal wire in the second wire region S4 through a signal connection wire made of the second source-drain metal layer 24.

Figure 5:
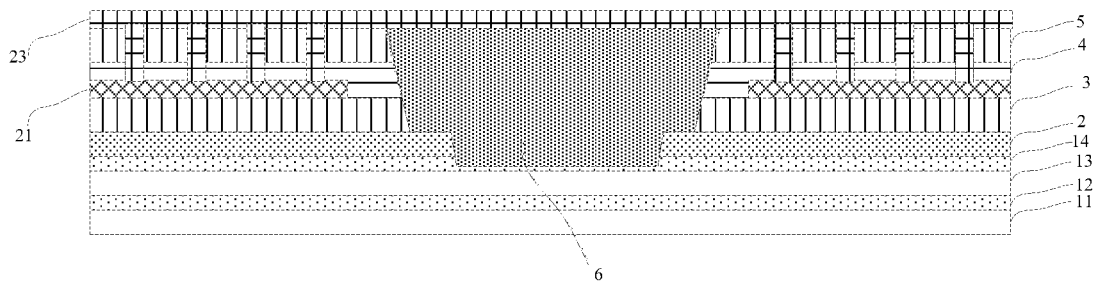
Figure 6:
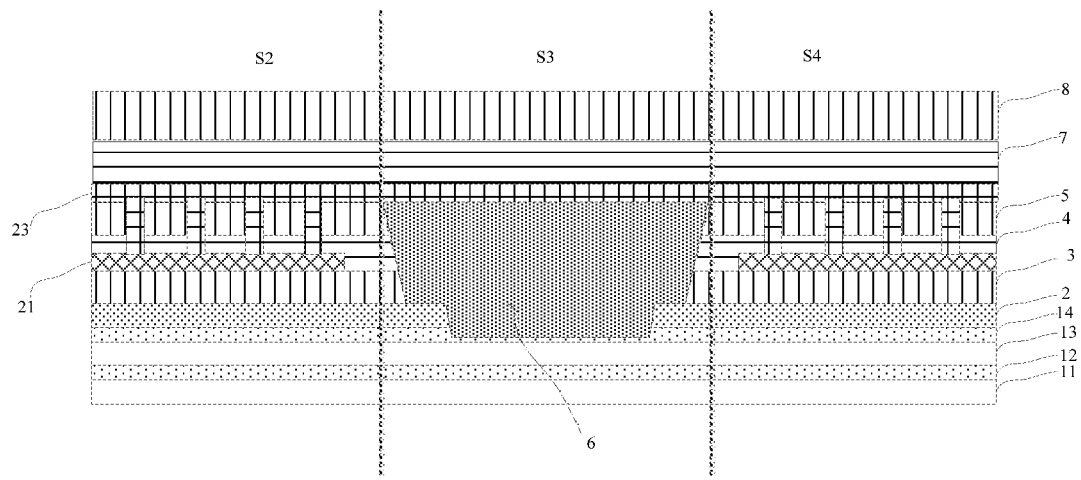
Figure 7:
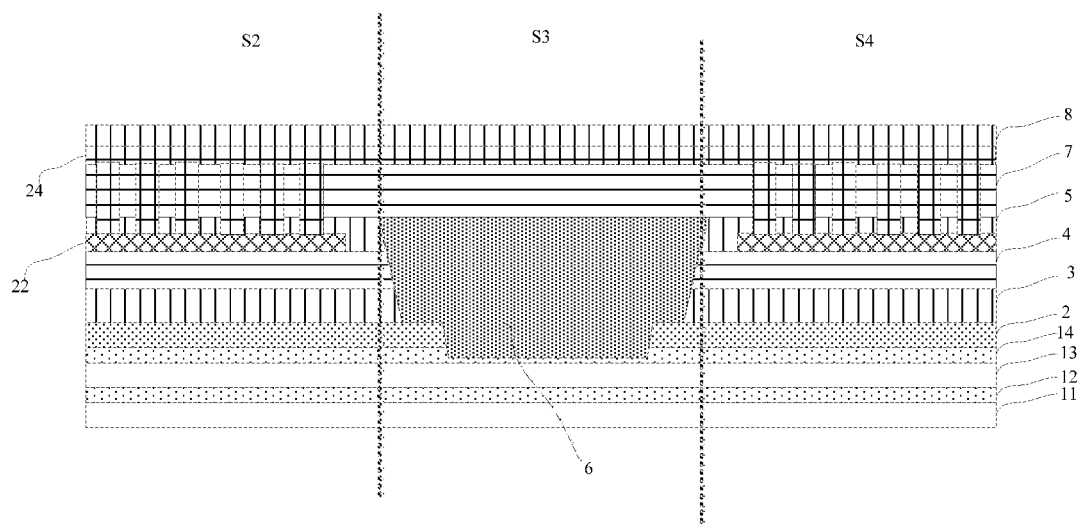

FIGS. 3 to 6 are schematic cross-sectional views of FIG. 2 in the AA direction, and FIG. 7 is a schematic cross-sectional view of FIG. 2 in the BB direction.

Figure 3:
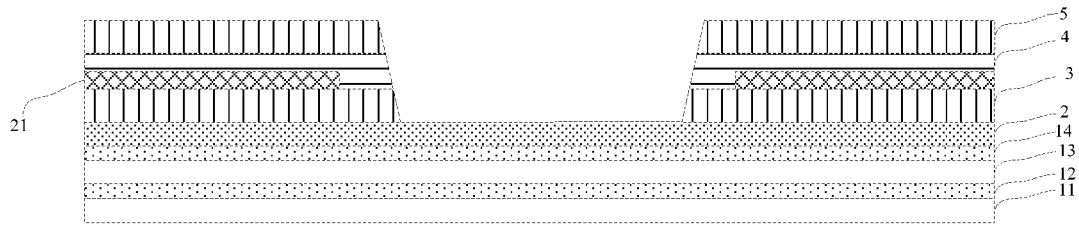
FIGS. 3 to 7 are schematic views showing the preparing the flexible display substrate in related art.
Figure 4:
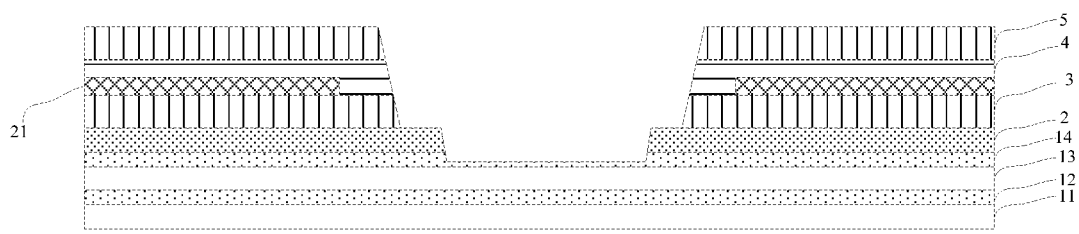

As shown in FIGS. 3 to 7, in the related art, when a flexible display substrate is prepared, in the bending area S3, the first wiring area S2 and the second wiring area S4, a buffer layer 2, a gate insulating layer 3, a first gate metal layer 21, a second gate insulating layer 4, a second gate metal layer 22 (since the second gate metal layer 22 is not provided in the AA direction and a second gate metal layer 22 is provided in the BB direction, FIGS. 3 to 6 do not show the second gate metal layer 22, and FIG. 7 shows the second gate metal layer 22), an interlayer insulating layer 5 and the like are first formed on the flexible substrate, in which the flexible substrate includes a first organic thin film 11, a first inorganic layer 12, a second organic thin film 13, and a second inorganic layer 14 that are sequentially stacked. In order to release the stress generated during bending of the inorganic film layer in the bending area, the inorganic insulating film layer in the bending area needs to be removed. As shown in FIG. 3, the interlayer insulating layer 5, the first gate insulating layer 3 and the second gate insulating layer 4 in the bending area are removed by the first dry etching; then, as shown in FIG. 4, the buffer layer 2 in the bending area is removed by the second dry etching. As shown in FIG. 2, L1 is the boundary line of the first etching, and L2 is the boundary line of the second etching; as shown in FIG. 4, a step structure is formed in the area where the inorganic insulating film is removed, to expose a part of the surface of the buffer layer 2.

After the buffer layer 2, the interlayer insulating layer 5, the first gate insulating layer 3, and the second gate insulating layer 4 in the bending area are removed, there is a large segment difference in the bending area. Therefore, as shown in FIG. 5, the organic material layer 6 needs to be formed in the bending area, and the organic material layer 6 is capable of reducing the segment difference in the bending area. Then, the first signal connection line is formed on the organic material layer 6 by the first source-drain metal layer 23, and the first signal connection line is connected to the first signal wiring formed by the first gate metal layer 21 in the first wiring area S2 and the second wiring area S4. Then, as shown in FIG. 6, a first planarization layer 7 covering the first source-drain metal layer 23 is formed. As shown in FIG. 7, a second signal connection line is formed by the second source-drain metal layer 24 on the first planarization layer 7 (since the second source-drain metal layer 24 is not provided in the AA direction and the second source-drain metal layer 24 is provided in the BB direction, the second source-drain metal layer 24 is not shown in FIG. 6, but shown in FIG. 7). The second signal connection line is connected to the second signal wiring formed by the second gate metal layer 22 in the first wiring area S2 and the second wiring area S4, and then the second planarization layer 8 covering the second source-drain metal layer is formed.

Among them, in the first wiring area S2 and the second wiring area S4, the first signal wiring and the second signal wiring are arranged alternately; in the bending area S3, the first wiring area S2 and the second wiring area S4, the first signal connection line and the second signal connection line are alternately arranged, the first signal wiring and the first signal connection line are only provided in the AA direction, and the second signal wiring and the second signal connection line are only provided in the BB direction. In FIGS. 3 to 7, as an example for illustration, the first signal wiring is connected to the first signal connection line, and the second signal wiring is connected to the second signal connection line. Of course, it is also possible that the first signal wiring and the second signal connection line are both located in the AA direction, and the first signal wiring is connected to the second signal connection line; and the second signal wiring and the second signal connection line are both located in the BB direction, and the second signal wiring is connected to the first signal connection line.

In the flexible display substrate of the related art, as shown in FIGS. 3 to 7, a signal connection line formed by a double-layer source-drain metal layer connects the signal wiring in the connection wiring area.

As mentioned above, after the inorganic layer in the bending area is removed by etching, in order to increase the flatness to avoid the subsequently formed film layer in the area such as the signal connection line from being broken due to the excessively large segment difference, one process is needed to prepare an organic material layer 6 to fill the groove formed by etching the bending area, thereby increasing the number of the patterning process of the flexible display substrate, and increasing the time and the cost for preparing the flexible display substrate.

The embodiments of the present disclosure provide a flexible display substrate, a method for preparing the same, and a display device, that are capable of reducing the number of the patterning process for preparing the flexible display substrate, and reducing the time and the cost for preparing the flexible display substrate.

The embodiments of the present disclosure provide a flexible display substrate. The flexible display substrate includes a flexible substrate and a display function layer located on the flexible substrate, the display function layer including a first metal layer and a second metal layer, and the second metal layer being located on a surface of the first metal layer away from the flexible substrate;

the flexible display substrate includes a display area and a peripheral area, the peripheral area including a bending area extending from the display area in a first direction, a first wiring area located between the display area and the bending area, and a second wiring area located on a surface of the bending area away from the display area, the bending area being bent along a second direction, and the first direction being substantially perpendicular to the second direction; and signal wirings of the first wiring area and of the second wiring area are separated from each other, the signal wiring of the first wiring area and the second signal wiring of the second wiring area being electrically connected through a signal connection line of the bending area, at least part of the signal wirings of the first wiring area and the second wiring area being located on a layer different from the signal connection lines of the bending area, and the signal connection line being made of the first metal layer and/or the second metal layer.

In some embodiments, the signal wiring includes a first signal wiring formed by a third metal layer and a second signal wiring formed by a fourth metal layer, the third metal layer being located on a surface of the fourth metal layer proximate to the flexible substrate, and the fourth metal layer being located on a surface of the first metal layer proximate to the flexible substrate.

In some embodiments, the display function layer includes a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate, in which the first metal layer may be the first source-drain metal layer, the second metal layer may be the second source-drain metal layer, the third metal layer may be the first gate metal layer, and the fourth metal layer may be the second gate metal layer.

The signal lines of the display area S1, e.g., a plurality of data lines, correspond to a plurality of signal wirings electrically connected to the first wiring area, and are connected to the signal wiring of the second wiring area in a one-to-one correspondence through a plurality of signal connection lines in the bending area.

For example, the signal wirings in the first wiring area and in the second wiring area are both formed by at least one of the first gate metal layer and the second gate metal layer. Since the first wiring area and the second wiring area need to cross the bending area in the direction from the display area to the non-display area (or binding area), in order to reduce the stress, a plurality of inorganic film layer under the source-drain metal layers is removed from the bending area, thereby removing the first gate metal layer, the second gate metal layer, the first gate insulating layer and the second gate insulating layer in the area. Thus, in order to achieve the signal connection between the first wiring area and the second wiring area, it is necessary in the area of the first wiring area proximate to the bending area to connect the signal wiring formed by at least one of the first gate metal layer and the second gate metal layer to the signal connection line formed by at least one of the first source-drain metal layer and the second source-drain metal layer through a via hole in a manner of changing layer; and after crossing the bending area, i.e., an area of the second wiring area proximate to the bending area, it is necessary to connect the signal wiring formed by at least one of the first gate metal layer and the second gate metal layer to the signal connection line formed by at least one of the first source-drain metal layer and the second source-drain metal layer in a manner of changing layer, thereby realizing the bridging of signal wirings in the bending area.

In some embodiments, the signal connection line is only made of the second source-drain metal layer.

In this embodiment, after the first etching and the second etching are performed to form the groove in the bending area, the first source-drain metal layer is not used to form the signal connection line, and only the second source-drain metal is used to form the signal connection line, which connects the first signal wiring in the first wiring area and the second wiring in the second wiring area. In this embodiment, since the signal connection line formed by the first source-drain metal layer is not provided in the bending area, the organic material layer between the first source-drain metal layer and the flexible substrate can be omitted, so that the patterning process for forming the organic material layer can be saved, thereby further reducing the number of the patterning process for preparing the flexible display substrate, and reducing the time and the cost for preparing the flexible display substrate.

In some embodiments, in the first wiring area and the second wiring area, the signal wiring may be directly connected to the signal connection line, that is, the signal wiring is directly connected to the signal connection line through a via hole, and there is no other metal layer therebetween. Alternatively, if there are too many layers between the signal wirings and the signal connection lines, for the reliability of the connection, the signal wirings can be connected to the signal connection line through the metal film layer between the signal wiring and the signal connection line, e.g., the transition connection line formed by the first source-drain metal layer.

In some embodiments, the signal wiring includes a first signal wiring formed by a first gate metal layer and a second signal wiring formed by a second gate metal layer. In the first wiring area S2 and the second wiring area S4, the first signal wiring and the second signal wiring are alternately arranged in a second direction, an orthogonal projection of the first signal wiring on the flexible substrate not overlapping an orthogonal projection of the second signal wiring on the flexible substrate.

Figure 8:
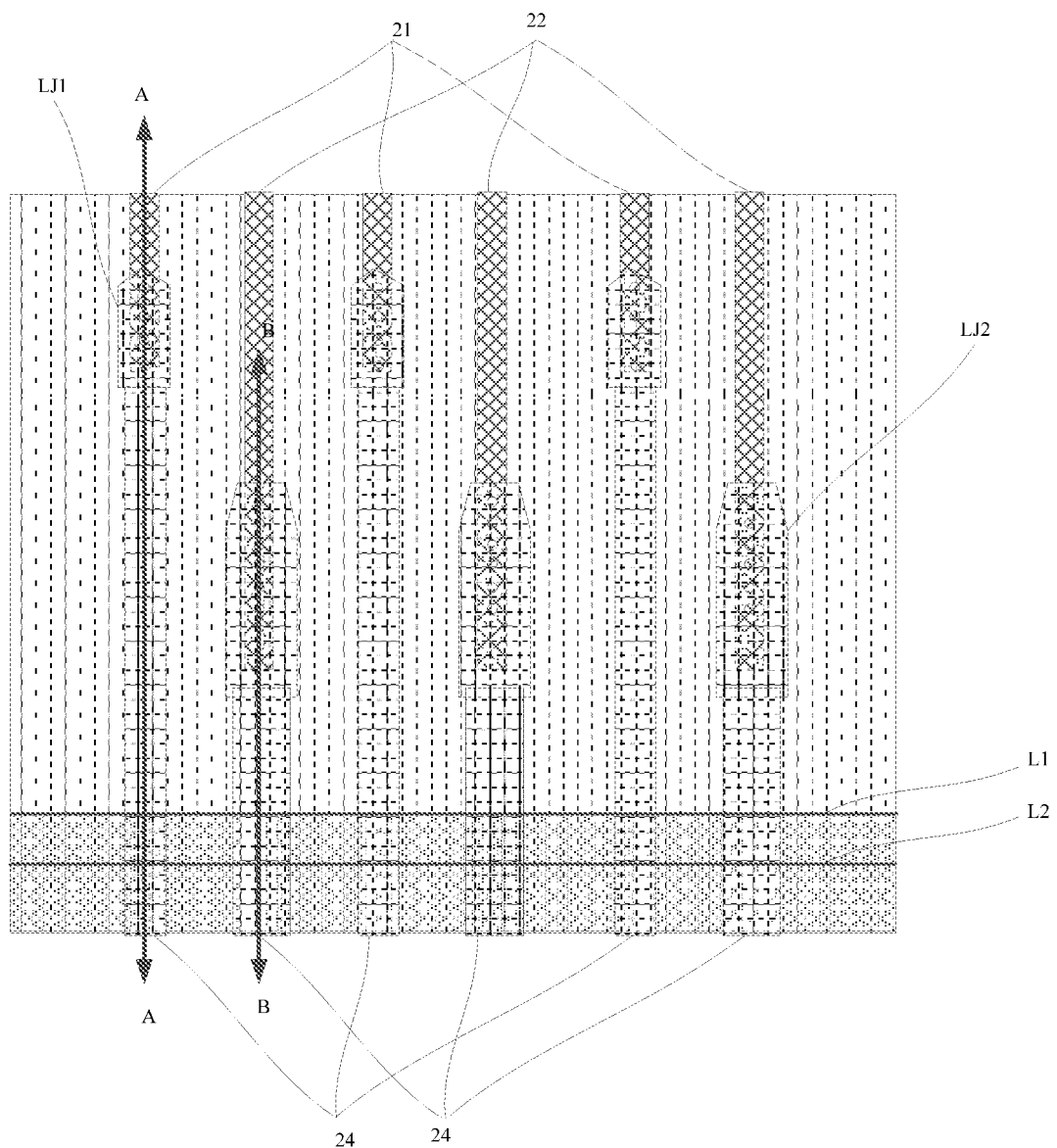
FIGS. 8 and 13 are schematic plan views showing a first wiring area of a flexible display substrate according to an embodiment of the present disclosure.
Figure 9:
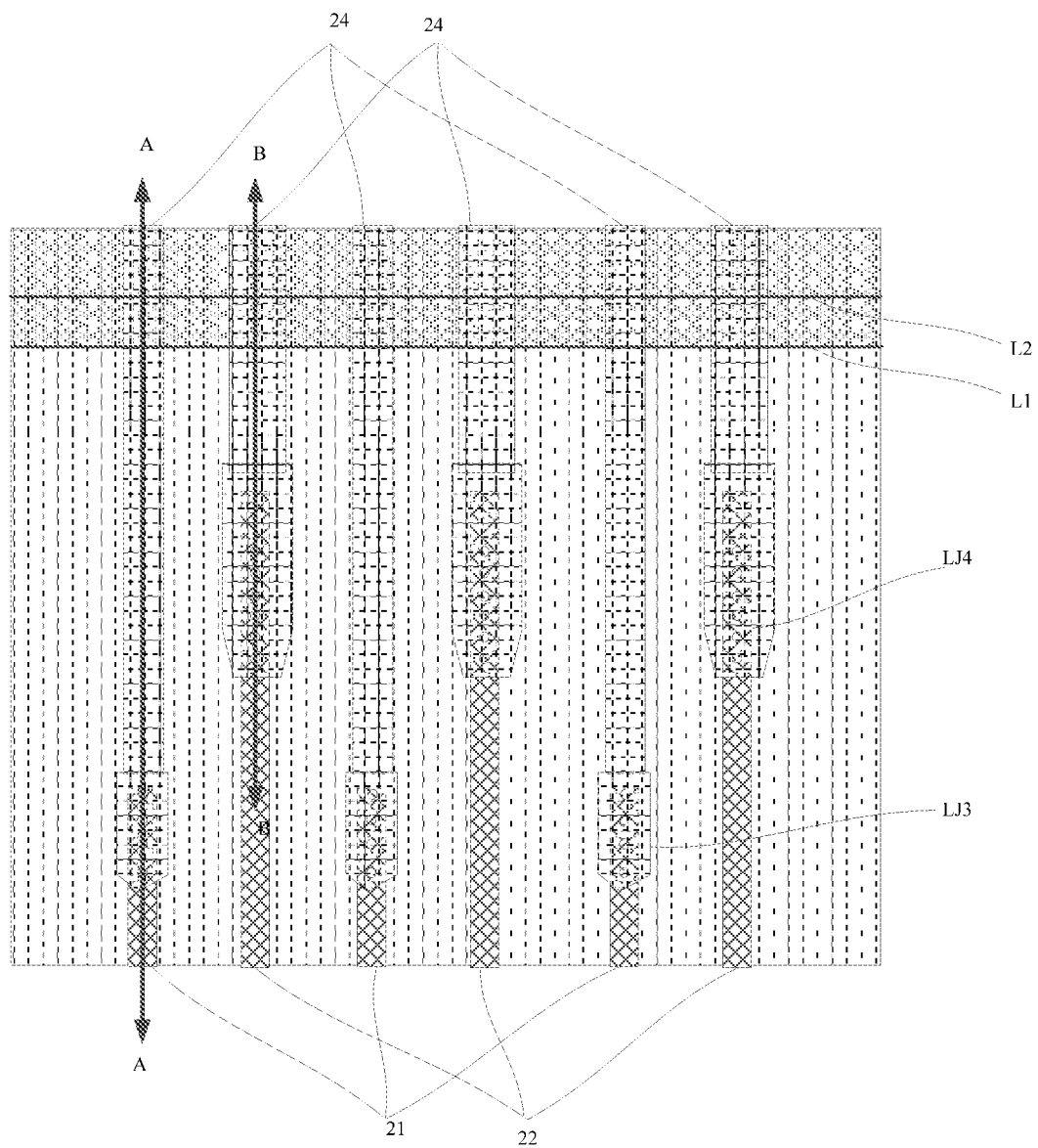
FIGS. 9 and 14 are schematic plan views showing a second wiring area of a flexible display substrate according to an embodiment of the present disclosure.

FIG. 8 is an enlarged schematic view of the area S8. As shown in FIG. 8, the first signal wiring made of the first gate metal layer 21 and the second signal wiring made of the second gate metal layer 22 are provided in the first wiring area S2, in which the first signal wiring and the second signal wiring in the first wiring area S2 are both connected to the first signal line and the second signal line in the second wiring area S4 through the signal connection line made of the second source-drain metal layer 24. FIG. 9 is an enlarged schematic view of the area S9. As shown in FIG. 9, a first signal line made of the first gate metal layer 21 and a second signal line made of the second gate metal layer 22 are provided in the second wiring area S4, in which the first signal wiring and the second signal wiring in the second wiring area S4 are both connected to the first signal line and the second signal line in the first wiring area S2 through the signal connection line made of the second source-drain metal layer 24.

In some embodiments, the number of the first signal wiring may be approximately equal to the number of the second signal wiring.

In some embodiments, as shown in FIGS. 8 and 9, the line width of the first signal wiring may be approximately equal to the line width of the second signal wiring.

In some embodiments, as shown in FIGS. 8 and 9, the distance in the second direction between each first signal wiring and two adjacent second signal wirings may be approximately the same, and the distance in the second direction between each second signal wiring and two adjacent first signal wirings may be approximately the same.

As shown in FIG. 8, in the first wiring area S2, the signal connection line made of the second source-drain metal layer 24 is connected to the first signal wiring made of the first gate metal layer 21 through the first connection portion LJ1, an area where the first connection portion LJ1 is located being provided with a plurality of via holes (specifically four via holes) located in a same straight line, and the first connection portion LJ1 being connected to the first signal wiring through the plurality of via holes; and the signal connection line made of the second source-drain metal layer 24 is connected to the second signal wiring made of the second gate metal layer 22 through the second connection portion LJ2, an area where the second connection portion LJ2 is located being provided with a plurality of via holes (specifically six via holes) located in a same straight line, and the second connecting portion LJ2 being connected to the second signal wiring through the plurality of via holes. Among them, the widths of the first connection portion LJ1 and the second connection portion LJ2 are greater than the widths of other portions of the signal connection line, so as to ensure the connection reliability.

As shown in FIG. 9, in the second wiring area S4, the signal connection line made of the second source-drain metal layer 24 is connected to the first signal wiring made of the first gate metal layer 21 through a third connection portion LJ3, an area where the third connection portion LJ3 is located being provided with a plurality of via holes (specifically four via holes) located in a same straight line, and the third connecting portion LJ3 being connected to the first signal wiring through the plurality of via holes; and the signal connection line made of the second source-drain metal layer 24 is connected to the second signal wiring made of the second gate metal layer 22 through a fourth connection portion LJ4, an area where the fourth connection portion LJ4 is located being provided with a plurality of via holes (specifically sixth via holes) located in a same straight line, and the fourth connecting portion LJ4 being connected to the second signal wiring through the plurality of via holes. Among them, the widths of the third connection portion LJ3 and the fourth connection portion LJ4 are greater than the widths of other portions of the signal connection line, so as to ensure the connection reliability. In this embodiment, in order to ensure connection reliability, the line width of the signal connection line may be greater than the line widths of the first signal line and the second signal line.

Each signal connection line includes a first connection portion LJ1 and a third connection portion LJ3, or includes a second connection portion LJ2 and a fourth connection portion LJ4.

In the first wiring area S2, the first connection portion LJ1 and the second connection portion LJ2 of the adjacent signal connection lines are staggered by a certain distance, so as to avoid short circuits or defects caused by process deviation; in the second wiring area S4, the third connection portion LJ3 and the fourth connection portion LJ4 of the adjacent signal connection lines are staggered by a certain distance, so as to avoid short circuits or defects caused by process deviation.

Figure 10:
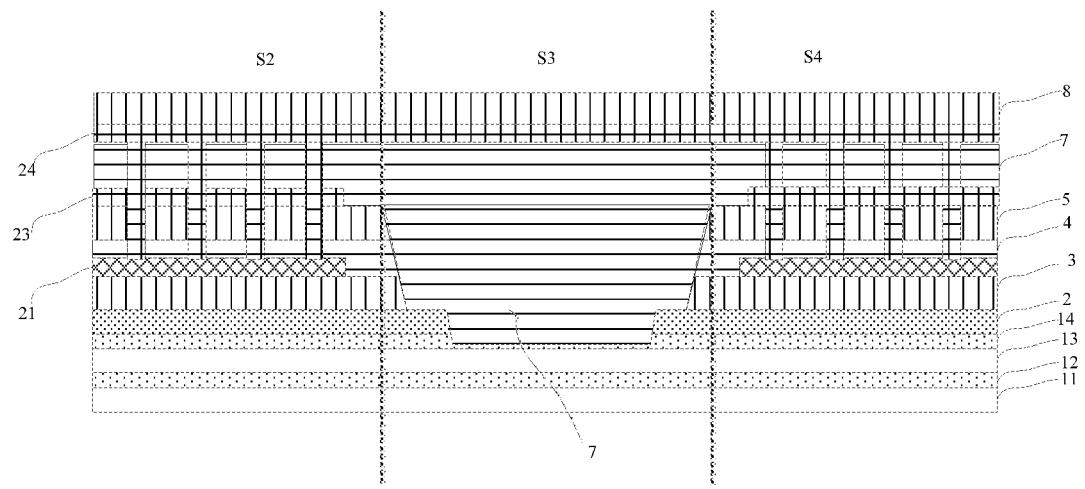
FIGS. 10 to 12 are schematic cross-sectional views showing a flexible display substrate according to an embodiment of the present disclosure.
Figure 11:
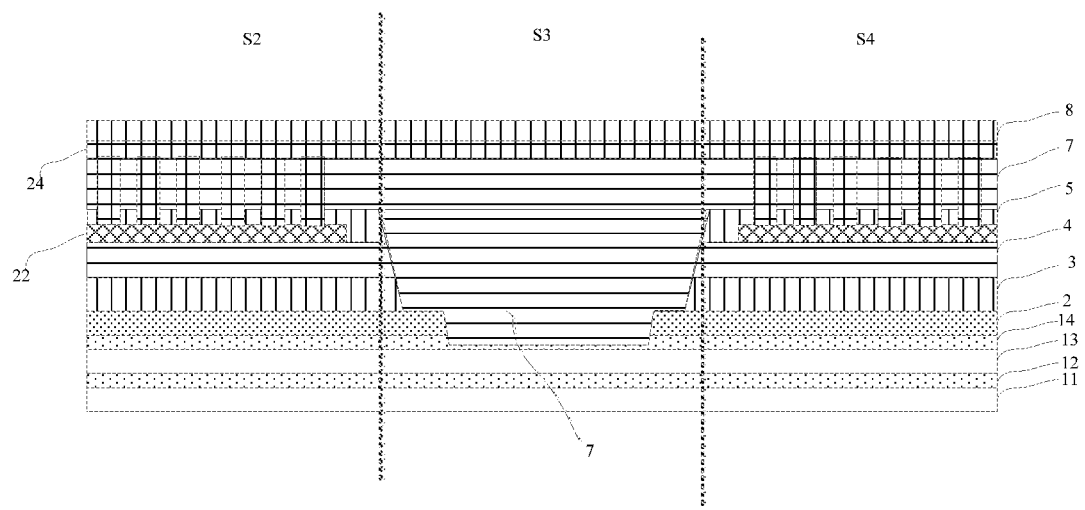

FIG. 10 is a schematic cross-sectional view of FIG. 8 or 9 in the AA direction; and FIG. 11 is a schematic cross-sectional view of FIG. 8 or 9 in the BB direction.

As shown in FIG. 10 and FIG. 11, in some embodiments, the display function layer includes a buffer layer 2, a first gate insulating layer 3, a first gate metal layer 21, a second gate insulating layer 4, a second gate metal layer 22, an interlayer insulating layer 5, a first source-drain metal layer 23, a first planarization layer 7, a second source-drain metal layer 24 and a second planarization layer 8 that are arranged in sequence in a direction away from the flexible substrate. In the bending area, the display function layer includes: a first planarization layer 7, a second source-drain metal layer 24, and a second planarization layer 8, in which a first planarization layer 7 and a second planarization layer 8 are in direct contact with the second source-drain metal layer 24, and in which there is no other film layer provided between the first planarization layer 7 (and the second planarization layer 8) and the second source-drain metal layer 24. In the bending area, since there is no need to provide the first source-drain metal layer 23, the organic material layer between the first source-drain metal layer 23 and the flexible substrate can be omitted, so that the patterning process for forming the organic material layer can be saved, thereby further reducing the number of the patterning process for preparing the flexible display substrate, and reducing the time and the cost for preparing the flexible display substrate.

In addition, in the bending area, at least one of the inorganic insulating film layer including the buffer layer 2, the first gate insulating layer 3, the second gate insulating layer 4 and the interlayer insulating layer 5 is removed, thereby being capable of reducing the stress generated when the above inorganic insulating film layer is bent in the bending area. Further, the buffer layer 2, the first gate insulating layer 3, the second gate insulating layer 4 and the interlayer insulating layer 5 may all be removed. In some embodiments, a part of the second inorganic layer in the substrate may be removed as needed, so that the thickness of the second inorganic layer in the bending area is less than the thickness of the second inorganic layer in other areas, e.g., the display area, the first wiring area, and the second wiring area, to better reduce the stress generated during the bending. In some embodiments, the groove formed by etching in the bending area will expose the surface of the second inorganic layer, and the material of the first planarization layer formed subsequently to fill the groove will be in contact with the surface of the second inorganic layer. In some embodiments, since the second inorganic layer is etched away, the groove formed by etching in the bending area will expose the surface of the second organic layer, and the material of the first planarization layer formed subsequently to fill the groove will be in contact with the surface of the second inorganic layer.

As shown in FIG. 11, the second signal wiring formed by the second gate metal layer 22 in the first wiring area S2 and the second wiring area S4 is connected to the signal connection line formed by the second source-drain metal layer 24 through a via hole; as shown in FIG. 10, the first signal wiring formed by the first gate metal layer 21 in the first wiring area S2 and the second wiring area S4 is connected to the signal connection line formed by the second source-drain metal layer 24 through the transition connection line formed by the first source-drain metal layer 23, thereby being capable of avoiding too many film layer between the first gate metal layer 21 and the second source-drain metal layer 24 and poor connection caused by the excessive depth of the via hole. Of course, in the first wiring area S2 and the second wiring area S4, the second signal wiring formed by the second gate metal layer 22 can also be connected to the signal connection line formed by the second source-drain metal layer 24 through the transition connection line formed by the first source-drain metal layer 23, thereby being capable of avoiding too many film layer between the second gate metal layer 22 and the second source-drain metal layer 24 and poor connection caused by the excessive depth of the via hole.

Among them, the line width of the transition connection line and the line width of the signal connection line can be substantially the same, in which there is an overlap area between the orthogonal projection of the transition connection line on the flexible substrate and the orthogonal projection of the signal connection line on the flexible substrate, and the orthogonal projection of the via hole for connecting the transition connection line and the signal connection line on the flexible substrate is located within the overlapping area.

Figure 13:
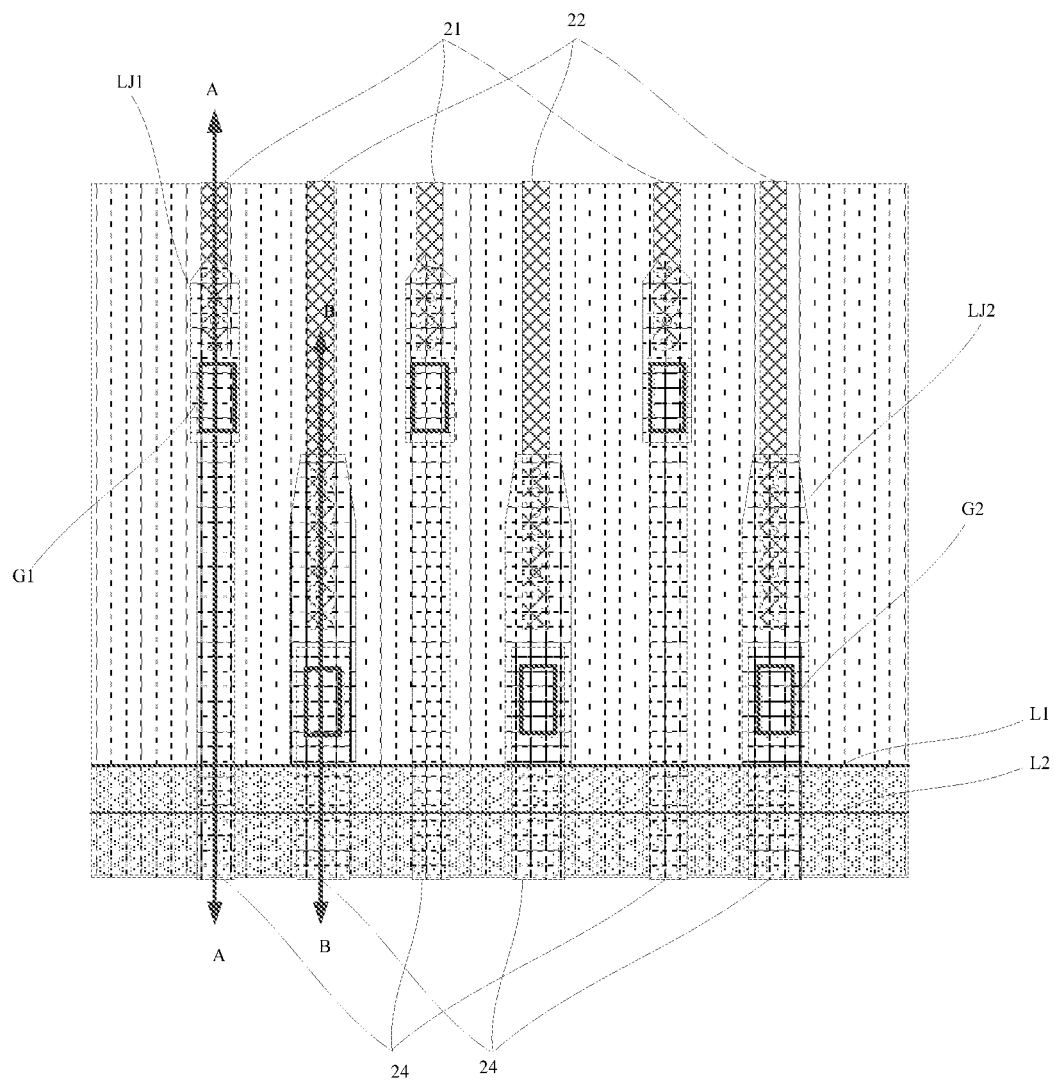

As shown in FIG. 13, in the first wiring area S2, when the signal connection line made of the second source-drain metal layer 24 is connected to the first signal line made of the first gate metal layer 21 through the first connection portion LJ1, an area where the first connection portion LJ1 is located being provided with a plurality of circular holes or a plurality of square holes located in a same straight line, and the first connection portion LJ1 being connected to the first signal wiring through the plurality of via holes. At the same time, one large via hole G1 can be provided in an area where the first connection portion LJ1 is located, and can be a rectangular via hole, in which the first connection portion LJ1 is connected to the transition connection line through the large via hole G1, and the large via hole G1 and the plurality of via holes may each occupy half of the first connection portion LJ1. When the signal connection line made of the second source-drain metal layer 24 is connected to the second signal line made of the second gate metal layer 22 through the second connection portion LJ2, an area where the second connection portion LJ2 is located being provided with a plurality of circular holes or a plurality of square holes located in a same straight line, and the second connection portion LJ2 being connected to the second signal wiring through the plurality of via holes. At the same time, one large via hole G2 can be provided in an area where the second connection portion LJ2 is located, and can be a rectangular via hole. The second connection portion LJ2 is connected to the transition connection line through the large via hole G2, and the large via hole G2 and the plurality of via holes may each occupy half of the second connection portion LJ2.

Figure 14:
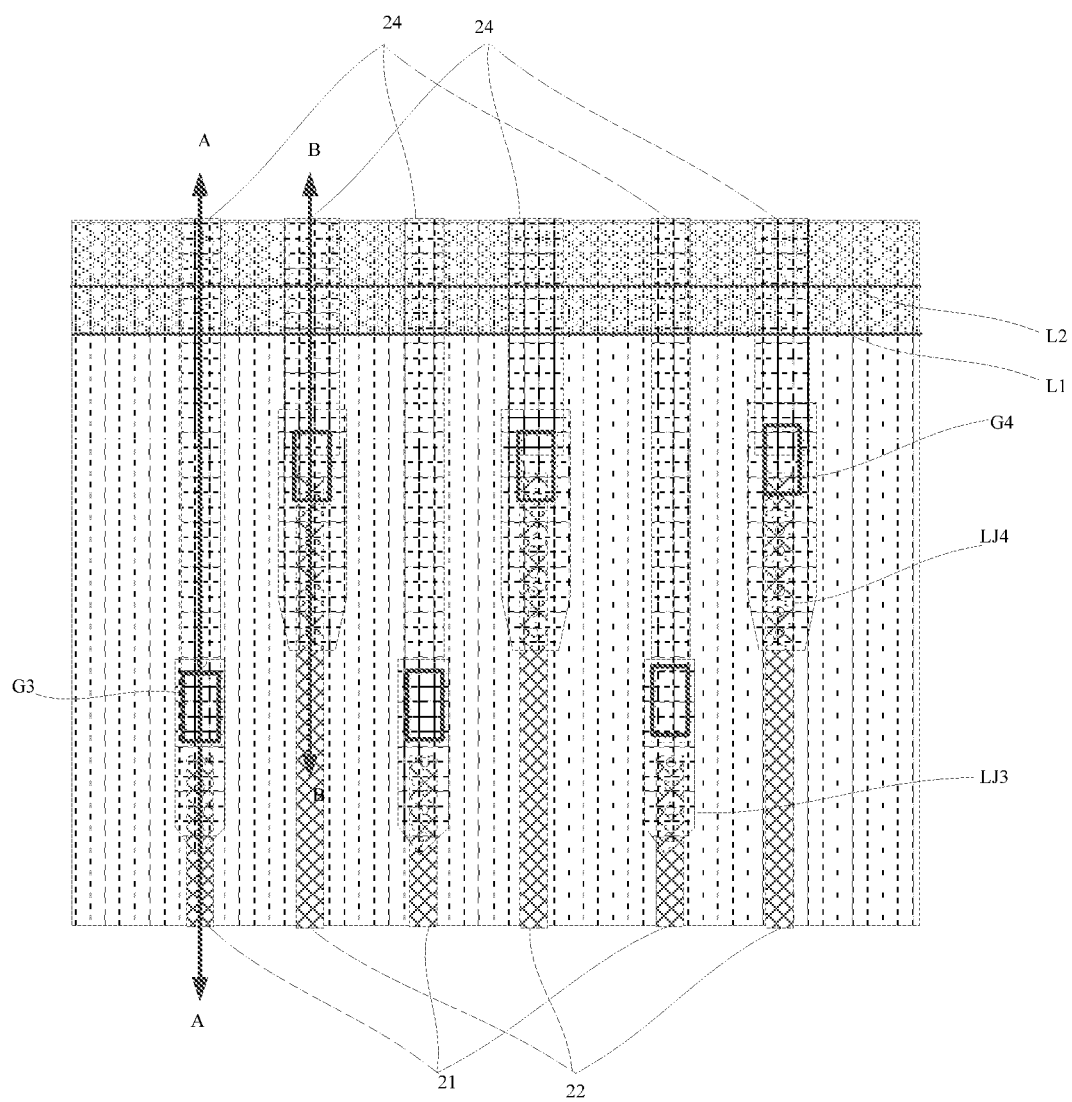

As shown in FIG. 14, in the second wiring area S4, when the signal connection line made of the second source-drain metal layer 24 is connected to the first signal line made by the first gate metal layer 21 through the third connection portion LJ3, an area where the third connection portion LJ3 is located being provided with a plurality of circular holes or a plurality of square holes located in a same straight line, and the third connection portion LJ3 being connected to the first signal wiring through the plurality of via holes. At the same time, one large via hole G3 can be provided in an area where the third connection portion LJ3 is located, and can be a rectangular via hole. The third connection portion LJ3 is connected to the transition connection line through the large via hole G3, and the large via hole G3 and the plurality of via holes may each occupy half of the third connection portion LJ3. When the signal connection line made of the second source-drain metal layer 24 is connected to the second signal line made of the second gate metal layer 22 through the fourth connection portion LJ4, an area where the fourth connection portion LJ4 is located being provided with a plurality of circular holes or a plurality of square holes located in a same straight line, and the fourth connection portion LJ4 being connected to the second signal wiring through the plurality of via holes. At the same time, one large via hole G4 can be provided in an area where the fourth connection portion LJ4 is located, and can be a rectangular via hole. The fourth connection portion LJ4 is connected to the transition connection line through the large via hole G4, and the large via hole G4 and the plurality of via holes may each occupy half of the fourth connection portion LJ4.

Of course, the connection between the signal wirings and the signal connection lines is not limited to those shown in FIGS. 10 and 11, but can also be a direct connection between the first signal wiring formed by the first gate metal layer 21 and the signal connection line formed by the second source-drain metal layer 24. The second signal wiring formed by the second gate metal layer 22 and the signal connection line formed by the second source-drain metal layer 24 are connected through the transition connection line formed by the first source-drain metal layer 23.

In some embodiments, the flexible substrate includes a first organic thin film 11, a first inorganic layer 12, a second organic thin film 13, and a second inorganic layer 14 that are stacked in sequence. The organic thin film and the inorganic layer that are stacked in sequence can allow the flexible substrate to have a good ability to isolate water and oxygen. Since the second inorganic layer 14 will also generate stress when the bending area is bent, the thickness of the second inorganic layer 14 in the bending area can be appropriately reduced, and the thickness of the second inorganic layer 14 in the bending area is less than the thickness of the second inorganic layer 14 in other areas.

In some embodiments, a first thickness of the flexible display substrate in the first wiring area S2 is equal to a second thickness of the flexible display substrate in the second wiring area S4, and a difference between a third thickness of the flexible display substrate in the bending area S3 and the first thickness of the flexible display substrate in the first wiring area S2 is less than 20% of the third thickness. In this way, the surface of the flexible display substrate can be substantially flat, so that the second source-drain metal layer 24 in the bending area is formed on the flat surface, and there will be no defective disconnection.

Figure 12:
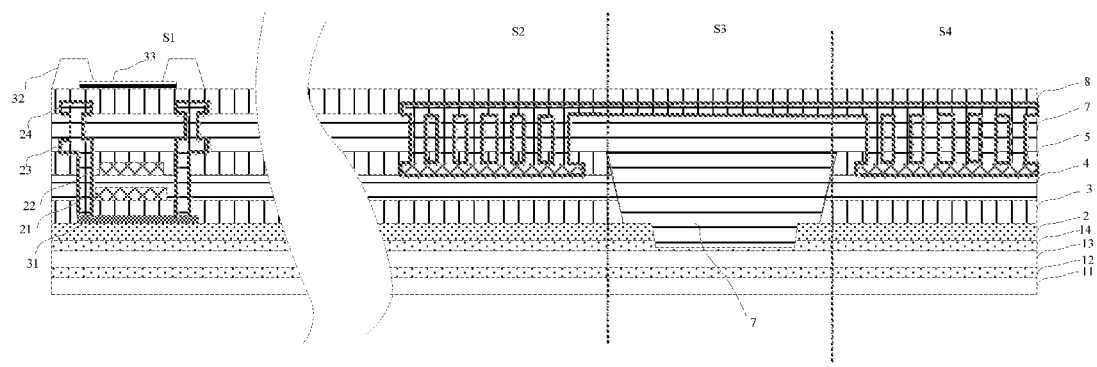

In a specific embodiment, as shown in FIG. 12, the display area of the flexible display substrate includes a buffer layer 2, an active layer 31, a first gate insulating layer 3, a first gate metal layer 21, a second gate insulating layer 4, a second gate insulating layer 22, an interlayer insulating layer 5, a first source-drain metal layer 23, a first planarization layer 7, a second source-drain metal layer 24, a second planarization layer 8, a pixel definition layer 32, an anode 33, and other film layers. The buffer layer 2, the first gate insulating layer 3, the first gate metal layer 21, the second gate insulating layer 4, the second gate metal layer 22, the interlayer insulating layer 5, the first source-drain metal layer 23, the first planarization layer 7, the second source-drain metal layer 24, and the second planarization layer 8 in the peripheral area of the flexible display substrate 23 are made in the same layer and of the same material as the corresponding film layers of the display area.

As shown in FIGS. 8 and 9, the first signal wiring made of the first gate metal layer 21 and the second signal wiring made of the second gate metal layer 22 are provided in the first wiring area S2, and the first signal wiring and the second signal wiring in the first wiring area S2 are both connected to the first signal line and the second signal line in the second wiring area S4 through the signal connection line made of the second source-drain metal layer 24. A first signal wiring made of the first gate metal layer 21 and a second signal wiring made of the second gate metal layer 22 are provided in the second wiring area S4. The first signal wiring and the second signal wiring in the second wiring area S4 are both connected to the first signal line and the second signal line in the first wiring area S2 through the signal connection line made of the second source-drain metal layer 24.

In the flexible display substrate of the present embodiment, the flexible substrate includes a first organic thin film 11, a first inorganic layer 12, a second organic thin film 13, and a second inorganic layer 14 that are stacked in sequence. Among them, the first organic thin film 11 and the second organic thin film 13 can be made of polyimide; the first inorganic layer 12 and the second inorganic layer 14 can be made of an oxide, a nitride or an oxynitride, and the corresponding reaction gas is $SiH_4$, $NH_3$, $N_2$ or $SiH_2Cl_2$, $NH_3$, $N_2$.

The buffer layer 2 can be made of an oxide, a nitride or an oxynitride, and the corresponding reaction gas is $SiH_4$, $NH_3$, $N_2$ or $SiH_2Cl_2$, $NH_3$, $N_2$.

The first gate insulating layer 3 and the second gate insulating layer 4 can be made of an oxide, a nitride or an oxynitride, and the corresponding reaction gas is $SiH_4$, $NH_3$, $N_2$ or $SiH_2Cl_2$, $NH_3$, $N_2$.

The interlayer insulating layer 5 can be made of an oxide, a nitride or an oxynitride, and the corresponding reaction gas is $SiH_4$, $NH_3$, $N_2$ or $SiH_2Cl_2$, $NH_3$, $N_2$.

The first planarization layer 7 and the second planarization layer 8 may be made of an organic material, such as an organic resin.

Figure 15:
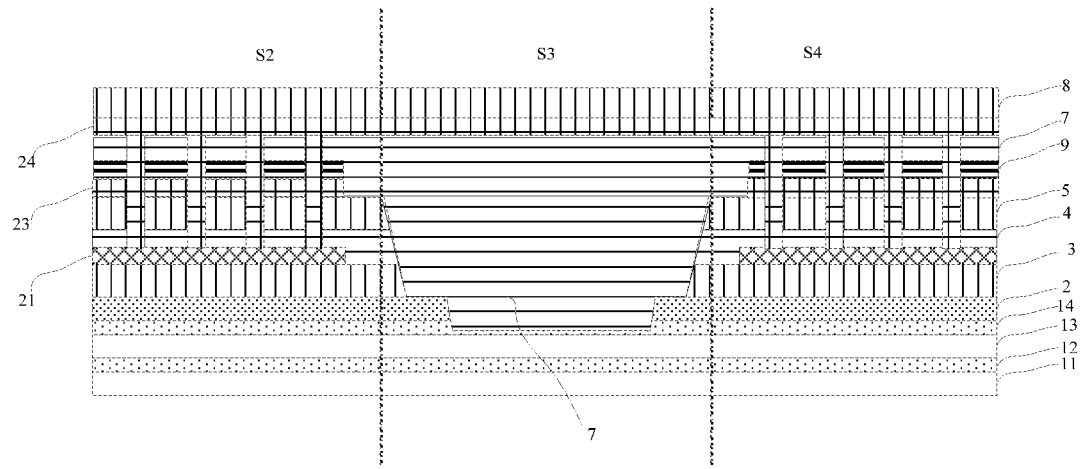
FIGS. 15-16 are schematic cross-sectional views showing a flexible display substrate according to another embodiment of the present disclosure.
Figure 16:
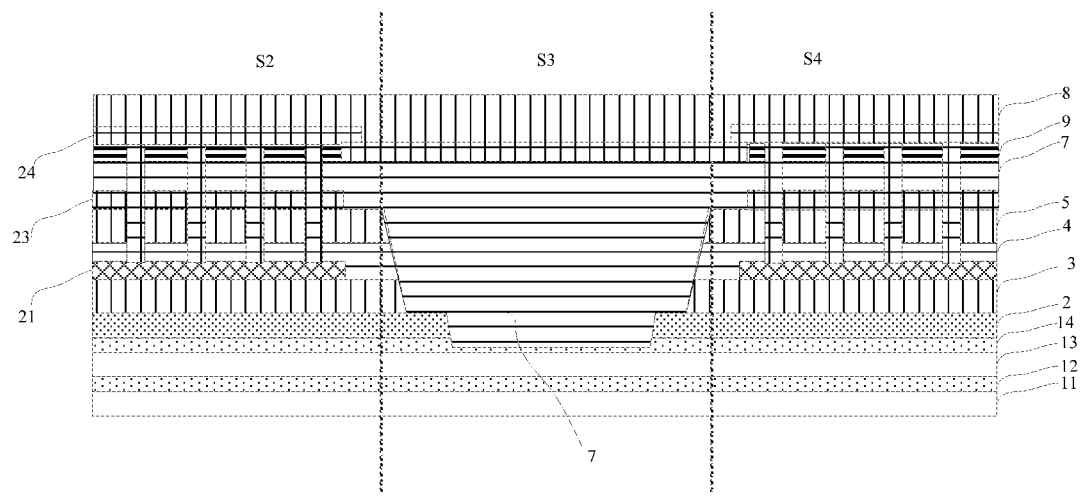

In another embodiments, as shown in FIGS. 15 and 16, in addition to the first planarization layer 7, a passivation layer 9 is provided between the first source-drain metal layer 23 and the second source-drain metal layer 24. The passivation layer 9 can be made of an oxide, a nitride or an oxynitride, the corresponding reaction gas is $SiH_4$, $NH_3$, $N_2$ or $SiH_2Cl_2$, $NH_3$, $N_2$, and the passivation layer 9 is used to protect the first source-drain metal layer 23. As shown in FIG. 15, the passivation layer 9 may be located on a surface of the first planarization layer 7 facing the flexible substrate; or, as shown in FIG. 16, the passivation layer 9 may also be located on a surface of the first planarization layer 7 away from the flexible substrate. Where the first planarization layer 7 is provided with a via hole, the passivation layer 9 is also provided with a via hole corresponding to the via hole of the first planarization layer 7, and the via hole of the passivation layer 9 communicates with the via hole of the first planarization layer 7.

Since the passivation layer 9 is mostly made of inorganic insulating materials and stress will also be generated when the bending area is bent, the passivation layer 9 in the bending area needs to be removed.

An embodiment of the present disclosure also provides a display device including the flexible display substrate as described above.

The display device includes but is not limited to: a radio frequency unit, a network module, an audio output unit, an input unit, a sensor, a display unit, an user input unit, an interface unit, a memory, a processor, a power supply and other components. Those skilled in the art would understand that the structure of the above display device does not constitute a limitation on the display device, and the display device may include more or less of the above components, or combine some components, or have different component arrangements. In the embodiments of the present disclosure, the display device includes, but is not limited to, a displayer, a mobile phone, a tablet computer, a television, a wearable electronic device, a navigation display device, or the like.

The display device may be any product or component having a display function, such as a television, a display, a digital photo frame, a mobile phone, a tablet computer, etc., in which the display device further includes a flexible circuit board, a printed circuit board, and a backplane.

The embodiments of the present disclosure further provides a method for preparing a flexible display substrate including a flexible substrate and a display function layer located on the flexible substrate, in which the display function layer includes a first metal layer and a second metal layer located on a surface of the first metal layer away from the flexible substrate;

the flexible display substrate includes a display area and a peripheral area, the peripheral area including a bending area extending from the display area in a first direction, a first wiring area located between the display area and the bending area, and a second wiring area located on a surface of the bending area away from the display area, the bending area being bent along a second direction, and the first direction being substantially perpendicular to the second direction; and signal wirings of the first wiring area and the second wiring area are separated from each other, and the method includes:

forming a signal connection line by the first metal layer and/or the second metal layer in the bending area, the signal connection line connecting the signal wiring of the first wiring area and the signal wiring of the second wiring area, and at least part of the signal wirings in the first wiring area and the second wiring area being located in a layer different from the signal connection lines in the bending area.

In some embodiments, the signal wiring includes a first signal wiring formed by a third metal layer and a second signal wiring formed by a fourth metal layer, the third metal layer being located on a surface of the fourth metal layer proximate to the flexible substrate, and the fourth metal layer being located on a surface of the first metal layer proximate to the flexible substrate.

In some embodiments, the display function layer includes a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate. The first metal layer may be the first source-drain metal layer, the second metal layer may be the second source-drain metal layer, the third metal layer may be the first gate metal layer, and the fourth metal layer may be the second gate metal layer.

The signal lines of the display area S1, e.g., a plurality of data lines, correspond to a plurality of signal wirings electrically connected to the first wiring area, and are connected to the signal wiring of the second wiring area in a one-to-one correspondence through a plurality of signal connection lines in the bending area.

For example, the signal wirings in the first wiring area and in the second wiring area are both formed by at least one of the first gate metal layer and the second gate metal layer. Since the first wiring area and the second wiring area need to cross the bending area in the direction from the display area to the non-display area (or binding area), in order to reduce the stress, a plurality of inorganic film layer under the source-drain metal layers is removed from the bending area, and the first gate metal layer, the second gate metal layer, the first gate insulating layer and the second gate insulating layer in the area are also removed. Thus, in order to achieve the signal connection between the first wiring area and the second wiring area, it is necessary in the area of the first wiring area proximate to the bending area to connect the signal wiring formed by at least one of the first gate metal layer and the second gate metal layer to the signal connection line formed by at least one of the first source-drain metal layer and the second source-drain metal layer through a via hole in a manner of changing layer, and after crossing the bending area, i.e., an area of the second wiring area proximate to the bending area, it is necessary to connect the signal wiring formed by at least one of the first gate metal layer and the second gate metal layer to the signal connection line formed by at least one of the first source-drain metal layer and the second source-drain metal layer in a manner of changing layer, thereby realizing the bridging of signal wirings in the bending area.

In some embodiments, the forming the signal connection line by the first metal layer and/or the second metal layer in the bending area includes:

forming the signal connection line by the second metal layer.

In this embodiment, after the first etching and the second etching are performed to form the groove in the bending area, the first source-drain metal layer is not used to form the signal connection line, and only the signal connection line made of the second source-drain metal is provided, which connects the signal connection lines in the first wiring area and the second wiring area. In this embodiment, since the signal connection line formed by the first source-drain metal layer is not provided in the bending area, the organic material layer between the first source-drain metal layer and the flexible substrate can be omitted, so that the patterning process for forming the organic material layer can be saved, thereby further reducing the number of the patterning process for preparing the flexible display substrate, and reducing the time and the cost for preparing the flexible display substrate.

In some embodiments, in the first wiring area and the second wiring area, the signal wiring may be directly connected to the signal connection line. Alternatively, if there are too many layers between the signal wirings and the signal connection lines, for the reliability of the connection, the signal wirings can be connected to the signal connection line through the metal film layer between the signal wiring and the signal connection line, e.g., the transition connection line formed by the first source-drain metal layer.

When the signal wiring is connected to the signal connection line through the transition connection line formed by the first source-drain metal layer, the method further includes:

forming a transition connection line by the first metal layer in the first wiring area and the second wiring area, the transition connection line being connected to the signal wiring; and the forming the signal connection line includes:

forming the signal connection line connected to the transition connection line in the first wiring area and the second wiring area.

In some embodiments, the forming the signal wiring includes:

forming a first signal wiring by a third metal layer, and forming a second signal wiring by a fourth metal layer, the third metal layer being located on a surface of the fourth metal layer proximate to the flexible substrate, and the fourth metal layer being located on a surface of the first metal layer proximate to the flexible substrate.

FIG. 8 is an enlarged schematic view of the area S8. As shown in FIG. 8, the first signal wiring made of the first gate metal layer 21 and the second signal wiring made of the second gate metal layer 22 are provided in the first wiring area S2. The first signal wiring and the second signal wiring in the first wiring area S2 are both connected to the first signal line and the second signal line in the second wiring area S4 through the signal connection line made of the second source-drain metal layer 24. FIG. 9 is an enlarged schematic view of the area S9. As shown in FIG. 9, a first signal wiring made of the first gate metal layer 21 and a second signal wiring made of the second gate metal layer 22 are provided in the second wiring area S4. The first signal wiring and the second signal wiring in the second wiring area S4 are both connected to the first signal line and the second signal line in the first wiring area S2 through the signal connection line made of the second source-drain metal layer 24.

As shown in FIG. 8, in the first wiring area S2, the signal connection line made of the second source-drain metal layer 24 is connected to the first signal wiring made of the first gate metal layer 21 through the first connection portion LJ1, an area where the first connection portion LJ1 is located being provided with a plurality of via holes (specifically four via holes) located in a same straight line, and the first connection portion LJ1 being connected to the first signal wiring through the plurality of via holes; and the signal connection line made of the second source-drain metal layer 24 is connected to the second signal wiring made of the second gate metal layer 22 through the second connection portion LJ2, an area where the second connection portion LJ2 is located being provided with a plurality of via holes (specifically six via holes) located in a same straight line, and the second connecting portion LJ2 being connected to the second signal wiring through the plurality of via holes. The widths of the first connection portion LJ1 and the second connection portion LJ2 are greater than the widths of other portions of the signal connection line, so as to ensure the connection reliability.

As shown in FIG. 9, in the second wiring area S4, the signal connection line made of the second source-drain metal layer 24 is connected to the first signal wiring made of the first gate metal layer 21 through a third connection portion LJ3, an area where the third connection portion LJ3 is located being provided with a plurality of via holes (specifically four via holes) located in a same straight line, and the third connecting portion LJ3 being connected to the first signal wiring through the plurality of via holes; and the signal connection line made of the second source-drain metal layer 24 is connected to the second signal wiring made of the second gate metal layer 22 through a fourth connection portion LJ4, an area where the fourth connection portion LJ4 is located being provided with a plurality of via holes (specifically sixth via holes) located in a same straight line, and the fourth connecting portion LJ4 being connected to the second signal wiring through the plurality of via holes. The widths of the third connection portion LJ3 and the fourth connection portion LJ4 are greater than the widths of other portions of the signal connecting line, so as to ensure the connection reliability. In this embodiment, in order to ensure connection reliability, the line width of the signal connection line may be greater than the line widths of the first signal line and the second signal line.

Each signal connection line includes a first connection portion LJ1 and a third connection portion LJ3, or includes a second connection portion LJ2 and a fourth connection portion LJ4.

In the first wiring area S2, the first connection portion LJ1 and the second connection portion LJ2 of the adjacent signal connection lines are staggered by a certain distance, so as to avoid short circuits or defects caused by process deviation. In the second wiring area S4, the third connection portion LJ3 and the fourth connection portion LJ4 of the adjacent signal connection lines are staggered by a certain distance, so as to avoid short circuits or defects caused by process deviation.

FIG. 10 is a schematic cross-sectional view of FIG. 8 or 9 in the AA direction; and FIG. 11 is a schematic cross-sectional view of FIG. 8 or 9 in the BB direction.

As shown in FIG. 10 and FIG. 11, in some embodiments, the display function layer includes a buffer layer 2, a first gate insulating layer 3, a first gate metal layer 21, a second gate insulating layer 4, a second gate metal layer 22, an interlayer insulating layer 5, a first source-drain metal layer 23, a first planarization layer 7, a second source-drain metal layer 24 and a second planarization layer 8 that are arranged in sequence in a direction away from the flexible substrate. In the bending area, the display function layer includes: a first planarization layer 7, a second source-drain metal layer 24, and a second planarization layer 8.

The inorganic film layer to be removed in the bending area includes the buffer layer 2, the first gate insulating layer 3, the second gate insulating layer 4, and the interlayer insulating layer 5. Since there are many inorganic film layers to be removed, the above-mentioned inorganic film layer is relatively difficult to be removed by a single etching process, and the success rate for removing the above-mentioned inorganic film layer by a single etching process. Therefore, the above-mentioned inorganic film layers in the bending area can be removed by two or more etchings. In a specific example, the above inorganic film layer in the bending area can be removed by two etchings, and the method for preparing the flexible display substrate specifically includes:

after the forming the interlayer insulating layer 5, etching the interlayer insulating layer 5, the second gate insulating layer 4 and the first gate insulating layer 3 in the bending area, to remove the interlayer insulating layer 5, the second gate insulating layer 4, and the first gate insulating layer 3 in the bending area;

etching the buffer layer 2 in the bending area, to remove the buffer layer 2 in the bending area, and to form a groove exposing the flexible substrate in the bending area;

forming the first planarization layer 7, the first planarization layer 7 filling the groove in the bending area;

forming a pattern of the second source-drain metal layer 24 on the first planarization layer 7, a pattern of the second source-drain metal layer 24 including the signal connection line; and forming the second planarization layer 8.

As shown in FIGS. 10 to 12, the area of the first etching is larger than the area of the second etching. After the two etchings, a step structure is formed in the bending area S3, in which the bending area S3 is an axisymmetric structure, and the wiring area S2 and the second wiring area S2 are symmetrical with respect to the symmetry axis of the bending area S3.

In the bending area, since there is no need to provide the first source-drain metal layer 23, the organic material layer between the first source-drain metal layer 23 and the flexible substrate can be omitted, so that the patterning process for forming the organic material layer can be saved, thereby further reducing the number of the patterning process for preparing the flexible display substrate, and reducing the time and the cost for preparing the flexible display substrate.

In addition, in the bending area, the inorganic insulating film layer including the buffer layer 2, the first gate insulating layer 3, the second gate insulating layer 4 and the interlayer insulating layer 5 is removed, thereby being capable of avoiding the stress generated when the above inorganic insulating film layer is bent in the bending area.

In some embodiments, the flexible substrate includes a first organic thin film 11, a first inorganic layer 12, a second organic thin film 13, and a second inorganic layer 14 that are stacked in sequence, in which the organic thin film and the inorganic layer that are stacked in sequence can allow the flexible substrate to have a good ability to isolate water and oxygen. Since the second inorganic layer 14 will also generate stress when the bending area is bent, the thickness of the second inorganic layer 14 in the bending area can be appropriately reduced. When the buffer layer 2 is etched for the second time, the buffer layer 2 may be over-etched, to remove part of the second inorganic layer 14, so that the second inorganic layer 14 in the bending area is less than the thickness of the second inorganic layer 14 in other areas.

The method for preparing the flexible display substrate according to the present disclosure will be described in detail in conjunction with the drawings and specific embodiments, and the method for preparing the flexible display substrate according to this embodiment includes the following steps:

Step 1. As shown in FIG. 3, a buffer layer 2, an active layer, a first gate insulating layer 3, a first gate metal layer 21, a second gate insulating layer 4, and an interlayer insulating layer 5 were formed on a flexible substrate. The first gate insulating layer 3, the second gate insulating layer 4, and the interlayer insulating layer 5 in the bending area S3 were etched, to remove the first gate insulating layer 3, the second gate insulating layer 4 and the interlayer insulating layer 5 in the bending area S3.

The flexible substrate includes a first organic thin film 11, a first inorganic layer 12, a second organic thin film 13, and a second inorganic layer 14 that are stacked in sequence. The first organic thin film 11 and the second organic thin film 13 can be made of polyimide. The first inorganic layer 12 and the second inorganic layer 14 can improve the ability of the flexible display substrate to isolate water and oxygen.

The buffer layer 2 can be made of an oxide, a nitride or an oxynitride, and the corresponding reaction gas is $SiH_4$, $NH_3$, $N_2$ or $SiH_2Cl_2$, $NH_3$, $N_2$.

A semiconductor material layer was formed on the buffer layer 3, and the semiconductor material layer was patterned, to form an active layer (not shown).

A first gate insulating layer 3 was formed. The gate insulating layer 3 can be made of an oxide, a nitride or an oxynitride, and the corresponding reaction gas is $SiH_4$, $NH_3$, $N_2$ or $SiH_2Cl_2$, $NH_3$, $N_2$.

A first gate metal layer 21 was formed on the first gate insulating layer 3, and the first gate metal layer 21 was patterned to form a pattern of the first gate metal layer 21. As shown in FIGS. 8 and 9, in the first wiring area S2 and the second wiring area S4, the pattern of the first gate metal layer 21 includes a first signal wiring for transmitting signals.

The second gate insulating layer 4 is formed. The gate insulating layer 4 can be made of an oxide, a nitride or an oxynitride, and the corresponding reaction gas is $SiH_4$, $NH_3$, $N_2$ or $SiH_2Cl_2$, $NH_3$, $N_2$.

A second gate metal layer 22 was formed on the second gate insulating layer 4, and the second gate metal layer 22 was patterned to form a pattern of the second gate metal layer 22. As shown in FIGS. 8 and 9, in the first wiring area S2 and the second wiring area S4, the pattern of the second gate metal layer 22 includes a second signal wiring for transmitting signals.

An interlayer insulating layer 5 was formed. The interlayer insulating layer 5 can be made of an oxide, a nitride or an oxynitride, and the corresponding reaction gas is $SiH_4$, $NH_3$, $N_2$ or $SiH_2Cl_2$, $NH_3$, $N_2$.

Specifically, when the first gate insulating layer 3, the second gate insulating layer 4, and the interlayer insulating layer 5 in the bending region S3 were etched, a photoresist may be coated on the interlayer insulating layer 5, and the photoresist was exposed by using a mask. After development, a photoresist partly reserved area, a photoresist completely reserved area and a photoresist removed area were formed, in which the photoresist removed area corresponds to the bending area S3. The first gate insulating layer 3, the second gate insulating layer 4, and the interlayer insulating layer 5 in the photoresist removed area were dry-etched, to remove the first gate insulating layer 3, the second gate insulating layer 4 and the interlayer insulation layer 5 in the bending area B and to expose the buffer layer 2.

Step 2. As shown in FIG. 4, the buffer layer 2 and part of the second inorganic layer 14 were removed in the bending area S3.

After step 1, the remaining photoresist may not be stripped, and the buffer layer 2 and the second inorganic layer 14 in the bending area S3 may be subjected to a second dry etching, to remove the buffer layer 2 and part of the second inorganic layer in the bending area B. A groove was formed in the bending area. As shown in FIG. 4, the side wall of the groove in the bending area S3 had a step structure, and the bottom is substantially flat.

After that, the remaining photoresist can be stripped. After the photoresist was stripped, the interlayer insulating layer 5 can be subjected to a heat treatment. The heat treatment can cause the hydrogen ions in the interlayer insulating layer 5 to diffuse down into the active layer, and hydrogen bond passivated and repaired the dangling bonds and traps in the active layer, thereby improving the stability of the thin film transistor. The temperature of the heat treatment can be 347.5 to 402.5° C., and the oxygen concentration in the environment needs to be less than 100 ppm.

Step 3. As shown in FIG. 10, a first source-drain metal layer 23 was formed.

After the first gate insulating layer 3, the second gate insulating layer 4, the interlayer insulating layer 5, the buffer layer 2 and part of the second inorganic layer 14 in the bending area were removed, the pattern of the first source-drain metal layer 23 was formed on the interlayer insulating layer 5. As shown in FIG. 10, the pattern of the first source-drain metal layer 23 only exists in the first wiring area S2 and the second wiring area S4, but not in the bending area S3, to form a transition connection line, so as to be connected to the first signal wiring formed by the first gate metal layer 21.

Step 4. As shown in FIGS. 10 to 12, a first planarization layer 7 and a second source-drain metal layer 24 were formed.

After the first gate insulating layer 3, the second gate insulating layer 4, the interlayer insulating layer 5, the buffer layer 2 and part of the second inorganic layer 14 in the bending area were removed, there is a large segment difference in the bending area. If the second source-drain metal layer 24 was formed in the bending area, the second source-drain metal layer 24 was likely to be broken. Therefore, it is necessary to fill the groove of the bending area S3 with organic material, to form the first planarization layer 7. The first planarization layer 7 was patterned, and via holes exposing the first source-drain metal layer 23 was formed in the first wiring area S2 and the second wiring area S4.

A second source-drain metal layer 24 was formed on the first planarization layer 7, and the second source-drain metal layer 24 was patterned to form a pattern of the second source-drain metal layer 24. The signal connection lines formed by the second source-drain metal layer 24 existed in the first wiring area S2, the bending area S3, and the second wiring area S4. In the first wiring area S2 and the second wiring area S4, the second source-drain metal layer 24 was coupled to the first source-drain metal layer 23 through the via hole penetrating the first planarization layer 7, and then connected to the first signal wiring formed by the first gate metal layer 21. The second source-drain metal layer 24 was directly connected to the second signal wiring formed by the second gate metal layer 22 through the via hole penetrating the interlayer insulating layer 5 and the first planarization layer 7.

Thus, in the first wiring area S2 and the second wiring area S4, there was a double-layer source-drain metal layer pattern: the first source-drain metal layer 23 and the second source-drain metal layer 24. In the bending area S3, there was only a single-layer source-drain metal layer pattern, i.e., the second source-drain metal layer 24. The signal connection lines formed by the second source-drain metal layer 24 connected the first signal wiring and the second signal wiring in the first wiring area S2 and the second wiring area S4, thereby ensuring that the signal transmission of the first wiring area S2 and the second wiring area S4 were not affected, and the normal operation of the flexible display substrate would not be affected.

In this embodiment, in the bending are, only the second source-drain metal was provided, and the signal connection line was connected to the signal connection lines in the first wiring area and the second wiring area. In this embodiment, since the signal connection line formed by the first source-drain metal layer was not provided in the bending area, the organic material layer between the first source-drain metal layer and the flexible substrate can be omitted, so that the patterning process for forming the organic material layer can be saved, thereby further reducing the number of the patterning process for preparing the flexible display substrate, and reducing the time and the cost for preparing the flexible display substrate. In addition, the first source-drain metal layer was not provided in the bending area, thereby further reducing the stress generated in the bending area during bending.

After the above steps, the structure shown in FIGS. 10 to 12 can be obtained. In the first wiring area S2 and the second wiring area S4 adjacent to the bending area S3, the pattern of the first gate metal layer 21 includes the first signal wiring, the pattern of the second gate metal layer 22 includes the second signal wiring, and both the first signal wiring and the second signal wiring were connected to the signal connection line formed by the second source-drain metal layer 24, to jointly transmit signals.

In the method embodiments of the present disclosure, the serial numbers of the steps cannot be used to define the sequence of the steps. As for one skilled in the art, the changes in the order of steps without paying creative work also fall within the scope of the present disclosure.

It should be noted that the various embodiments in this specification are described in a progressive manner, and the same or similar portions between the various embodiments can be referred to each other, and each embodiment focuses on the differences from other embodiments. In particular, for some embodiments, since they are basically similar to the product embodiment, the description is relatively simple, and the relevant parts can be referred to a part of the description of the product embodiment.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above embodiments, the specific features, structures, or materials may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A flexible display substrate, comprising a flexible substrate and a display function layer located on the flexible substrate, wherein the display function layer comprises a first metal layer and a second metal layer located on a surface of the first metal layer away from the flexible substrate;

the flexible display substrate comprises a display area and a peripheral area, the peripheral area comprising a bending area extending from the display area in a first direction, a first wiring area located between the display area and the bending area, and a second wiring area located on a surface of the bending area away from the display area, the bending area being bent along a second direction, and the first direction being substantially perpendicular to the second direction;

signal wirings of the first wiring area and of the second wiring area are separated from each other, a signal wiring of the first wiring area and a second signal wiring of the second wiring area being electrically connected through a signal connection line of the bending area, at least part of the signal wirings of the first wiring area and the second wiring area being located on a layer different from a signal connection lines of the bending area, and the signal connection line being made of the second metal layer;

the signal wirings comprise a first signal wiring formed by a third metal layer and a second signal wiring formed by a fourth metal layer, the third metal layer being located on a surface of the fourth metal layer proximate to the flexible substrate, and the fourth metal layer being located on a surface of the first metal layer proximate to the flexible substrate; and the first signal wiring and the second signal wiring are alternately arranged in a second direction, an orthogonal projection of the first signal wiring on the flexible substrate not overlapping an orthogonal projection of the second signal wiring on the flexible substrate.

2. The flexible display substrate of claim 1, wherein in the first wiring area and the second wiring area, the signal wirings are directly connected to the signal connection line, or the signal wirings are connected to the signal connection line through a transition connection line formed by the first metal layer.

3. The flexible display substrate of claim 1, wherein the display function layer comprises a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate, the first metal layer being the first source-drain metal layer, the second metal layer being the second source-drain metal layer, the third metal layer being the first gate metal layer, and the fourth metal layer being the second gate metal layer; and in the bending area, the display function layer comprises: the first planarization layer, the second source-drain metal layer and the second planarization layer, the first planarization layer and the second planarization layer being in direct contact with the second source-drain metal layer.

4. The flexible display substrate of claim 3, wherein the flexible substrate comprises a first organic thin film, a first inorganic layer, a second organic thin film, and a second inorganic layer that are stacked in sequence, the second inorganic layer being located on a surface of the second organic thin film proximate to the display function layer, and the second inorganic layer in the bending area having a thickness less than that of the second inorganic layer in other areas.

5. The flexible display substrate of claim 3, wherein a first thickness of the flexible display substrate in the first wiring area is equal to a second thickness of the flexible display substrate in the second wiring area, and a difference between a third thickness of the flexible display substrate in the bending area and the first thickness of the flexible display substrate in the first wiring area is less than 20% of the third thickness.

6. The flexible display substrate of claim 3, wherein
in the first wiring area, the signal connection line made of the second source-drain metal layer is connected to the first signal wiring made of the first gate metal layer through a first connection portion, an area where the first connection portion is located being provided with a plurality of via holes located in a same straight line, and the first connection portion being connected to the first signal wiring through the plurality of via holes; and the signal connection line made of the second source-drain metal layer is connected to the second signal wiring made of the second gate metal layer through a second connection portion, an area where the second connection portion is located being provided with a plurality of via holes located in a same straight line, and the second connection portion being connected to the second signal wiring through the plurality of via holes;
in the second wiring area, the signal connection line made of the second source-drain metal layer is connected to the first signal wiring made of the first gate metal layer through a third connection portion, an area where the third connection portion is located being provided with a plurality of via holes located in a same straight line, and the third connection portion being connected to the first signal wiring through the plurality of via holes; and the signal connection line made of the second source-drain metal layer is connected to the second signal wiring made of the second gate metal layer through a fourth connection portion, an area where the fourth connection portion is located being provided with a plurality of via holes located in a same straight line, and the fourth connection portion being connected to the second signal wiring through the plurality of via holes.

7. The flexible display substrate of claim 6, wherein
widths of the first connection portion and the second connection portion are both greater than widths of other portions in the signal connection line; and/or
widths of the third connection portion and the fourth connection portion are both greater than widths of other portions in the signal connection line.

8. The flexible display substrate of claim 6, wherein
in the first wiring area, the first connection portion and the second connection portion adjacent to each other are staggered in the second direction by a certain distance; and/or
in the second wiring area, the third connection portion and the fourth connection portion adjacent to each other are staggered in the second direction by a certain distance.

9. A display device, wherein it comprises the flexible display substrate of claim 1.

10. A method for preparing a flexible display substrate of claim 1 wherein the method comprises:
forming the signal connection line by the second metal layer in the bending area, the signal connection line connecting the signal wiring of the first wiring area and the signal wiring of the second wiring area, and at least part of the signal wirings in the first wiring area and the second wiring area being located in a layer different from the signal connection lines in the bending area.

11. The method of claim 10, wherein the forming the signal connection line by the first metal layer and/or the second metal layer in the bending area comprises:
forming the signal connection line by the second metal layer.

12. The method of claim 10, wherein the method further comprises:
forming a transition connection line by the first metal layer in the first wiring area and the second wiring area, the transition connection line being connected to the signal wiring; and
the forming the signal connection line comprises:
forming the signal connection line connected to the transition connection line in the first wiring area and the second wiring area.

13. The method of claim 11, wherein the forming the signal wiring comprises:
forming a first signal wiring by a third metal layer, and forming a second signal wiring by a fourth metal layer, the third metal layer being located on a surface of the fourth metal layer proximate to the flexible substrate, and the fourth metal layer being located on a surface of the first metal layer proximate to the flexible substrate.

14. The method of claim 13, wherein the display function layer comprises a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate, the first metal layer being the first source-drain metal layer, the second metal layer being the second source-drain metal layer, the third metal layer being the first gate metal layer, and the fourth metal layer being the second gate metal layer;
the method specifically comprises:
after the forming the interlayer insulating layer, etching the interlayer insulating layer, the second gate insulating layer and the first gate insulating layer in the bending area, to remove the interlayer insulating layer, the second gate insulating layer, and the first gate insulating layer in the bending area;
etching the buffer layer in the bending area, to remove the buffer layer in the bending area, and to form a groove exposing the flexible substrate in the bending area;
forming the first planarization layer, the first planarization layer filling the groove in the bending area;
forming a pattern of the second source-drain metal layer on the first planarization layer, a pattern of the second source-drain metal layer comprising the signal connection line; and
forming the second planarization layer.

15. The display device of claim 9, wherein in the first wiring area and the second wiring area, the signal wirings are directly connected to the signal connection line, or the signal wirings are connected to the signal connection line through a transition connection line formed by the first metal layer.

16. The display device of claim of claim 9, wherein the display function layer comprises a buffer layer, an active layer, a first gate insulating layer, a first gate metal layer, a second gate insulating layer, a second gate metal layer, an interlayer insulating layer, a first source-drain metal layer, a first planarization layer, a second source-drain metal layer and a second planarization layer that are arranged in sequence in a direction away from the flexible substrate, the first metal layer being the first source-drain metal layer, the second metal layer being the second source-drain metal layer, the third metal layer being the first gate metal layer, and the fourth metal layer being the second gate metal layer; and in the bending area, the display function layer comprises: the first planarization layer, the second source-drain metal layer and the second planarization layer, the first planarization layer and the second planarization layer being in direct contact with the second source-drain metal layer.

17. The display device of claim of claim 16, wherein the flexible substrate comprises a first organic thin film, a first inorganic layer, a second organic thin film, and a second inorganic layer that are stacked in sequence, the second inorganic layer being located on a surface of the second organic thin film proximate to the display function layer, and the second inorganic layer in the bending area having a thickness less than that of the second inorganic layer in other areas.

18. The display device of claim of claim 16, wherein a first thickness of the flexible display substrate in the first wiring area is equal to a second thickness of the flexible display substrate in the second wiring area, and a difference between a third thickness of the flexible display substrate in the bending area and the first thickness of the flexible display substrate in the first wiring area is less than 20% of the third thickness.

19. The display device of claim of claim 16, wherein
in the first wiring area, the signal connection line made of the second source-drain metal layer is connected to the first signal wiring made of the first gate metal layer through a first connection portion, an area where the first connection portion is located being provided with a plurality of via holes located in a same straight line, and the first connection portion being connected to the first signal wiring through the plurality of via holes; and the signal connection line made of the second source-drain metal layer is connected to the second signal wiring made of the second gate metal layer through the second connection portion, an area where the second connection portion is located being provided with a plurality of via holes located in a same straight line, and the second connection portion being connected to the second signal wiring through the plurality of via holes;

in the second wiring area, the signal connection line made of the second source-drain metal layer is connected to the first signal wiring made of the first gate metal layer through a third connection portion, an area where the third connection portion is located being provided with a plurality of via holes located in a same straight line, and the third connection portion being connected to the first signal wiring through the plurality of via holes; and the signal connection line made of the second source-drain metal layer is connected to the second signal wiring made of the second gate metal layer through a fourth connection portion, an area where the fourth connection portion is located being provided with a plurality of via holes located in a same straight line, and the fourth connection portion being connected to the second signal wiring through the plurality of via holes.

20. The display device of claim of claim 19, wherein
widths of the first connection portion and the second connection portion are both greater than widths of other portions in the signal connection line; and/or
widths of the third connection portion and the fourth connection portion are both greater than widths of other portions in the signal connection line.

* * * * *